(12) United States Patent
Landru et al.

(10) Patent No.: US 9,589,830 B2
(45) Date of Patent: Mar. 7, 2017

(54) METHOD FOR TRANSFERRING A USEFUL LAYER

(71) Applicants: Soitec, Crolles Cedex (FR); Commissariat A L'Energie Atomique et aux Energies Alternatives, Paris (FR)

(72) Inventors: Didier Landru, Champ Pres Froges (FR); Oleg Kononchuk, Grenoble (FR); Nadia Ben Mohamed, Echirolles (FR); Damien Massy, Grenoble (FR); Frederic Mazen, Saint Egreve (FR); Francois Rieutord, Saint Egreve (FR)

(73) Assignees: Soitec, Crolles (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/686,229

(22) Filed: Apr. 14, 2015

(65) Prior Publication Data

US 2015/0303098 A1  Oct. 22, 2015

(30) Foreign Application Priority Data

Apr. 16, 2014 (FR) .................................. 14 53400

(51) Int. Cl.
  *H01L 21/762* (2006.01)
  *H01L 21/683* (2006.01)
(52) U.S. Cl.
  CPC .... *H01L 21/76254* (2013.01); *H01L 21/6835* (2013.01); *H01L 2221/68363* (2013.01); *H01L 2221/68381* (2013.01)

(58) Field of Classification Search
  CPC ................ H01L 21/762; H01L 21/683; H01L 21/76254; H01L 21/6835; H01L 21/02032;
  (Continued)

(56) References Cited

U.S. PATENT DOCUMENTS

2007/0281445 A1* 12/2007 Nguyen ............ H01L 21/76254
                                                         438/465

FOREIGN PATENT DOCUMENTS

FR    2861497 A1   4/2005
WO    0180308 A2  10/2001
(Continued)

OTHER PUBLICATIONS

French Search Report for French Application No. 1453400 dated Feb. 11, 2015, 2 pages.

*Primary Examiner* — Selim Ahmed
(74) *Attorney, Agent, or Firm* — TraskBritt (57) ABSTRACT

A method for transferring a useful layer onto a support includes the following processes: formation of a fragilization plane through the implantation of light species into a first substrate in such a way as to form a useful layer between this plane and a surface of the first substrate; application of the support onto the surface of the first substrate to form an assembly to be fractured having two exposed sides; thermal fragilization treatment of the assembly to be fractured; and initiation and self-sustained propagation of a fracture wave in the first substrate along the fragilization plane. At least one of the sides of the assembly to be fractured is in close contact, over a contact zone, with an absorbent element suitable for capturing and dissipating acoustic vibrations emitted during the initiation and/or propagation of the fracture wave.

21 Claims, 5 Drawing Sheets

(58) Field of Classification Search
CPC ..... H01L 21/185; H01L 21/304; H01L 21/20; H01L 21/70; H01L 21/76259
USPC ........................................................ 438/458
See application file for complete search history.

(56) References Cited

FOREIGN PATENT DOCUMENTS

WO        2005043615 A1    5/2005
WO        2005043616 A1    5/2005

* cited by examiner

METHOD FOR TRANSFERRING A USEFUL LAYER

PRIORITY CLAIM

This application claims the benefit of the filing date of French Patent Application Ser. No. 1453400, filed Apr. 16, 2014, and titled "METHOD FOR TRANSFERRING A USEFUL LAYER."

TECHNICAL FIELD

The present disclosure relates to a method for transferring a useful layer onto a supporting substrate.

BACKGROUND

Figure 1:
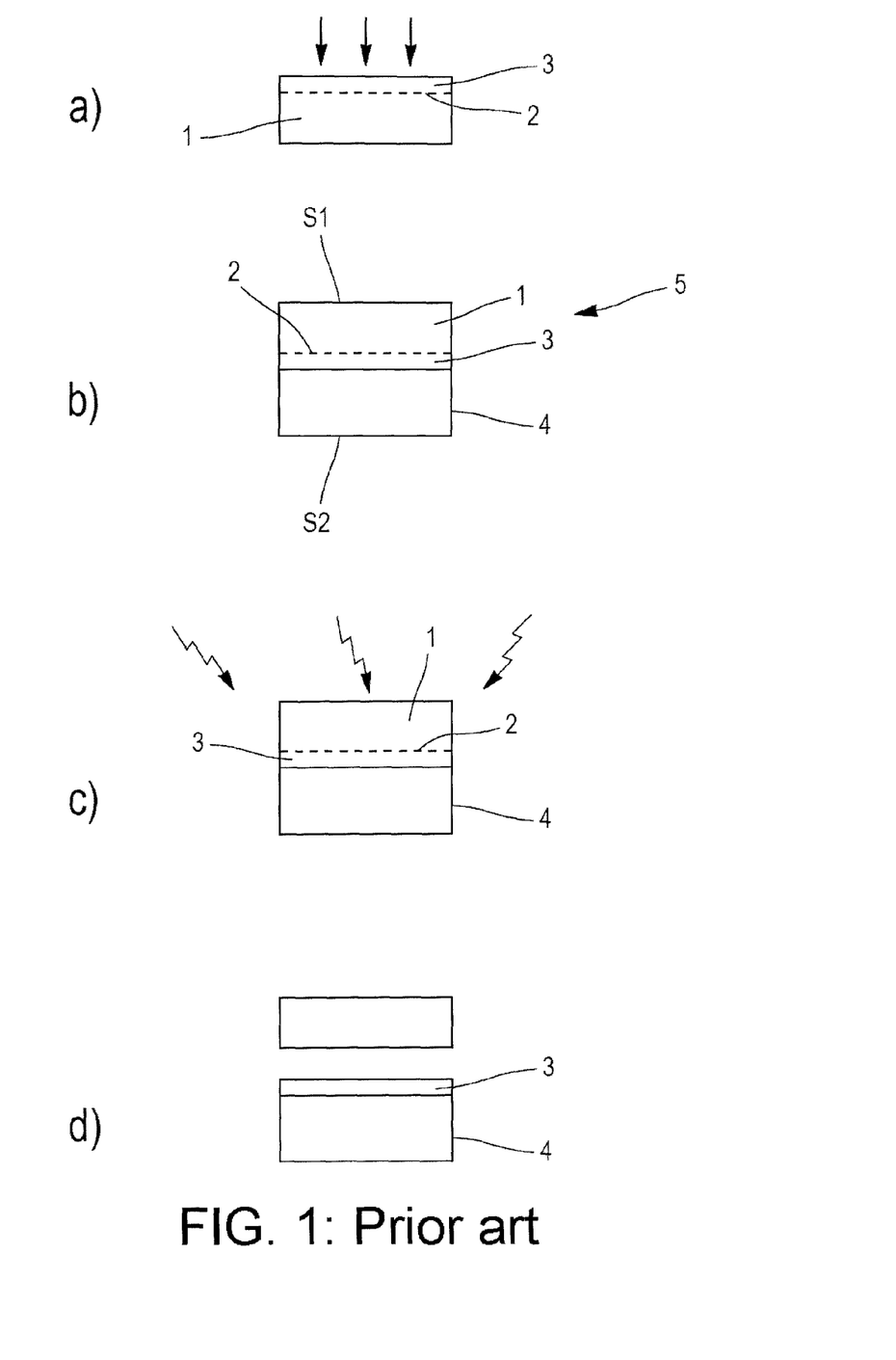
FIG. 1 shows a method for transferring a useful layer onto a support according to the prior art.

A method for transferring a useful layer 3 onto a supporting substrate 4, shown in FIG. 1, is known from the prior art. This method includes the following main steps:
  a) the formation of a fragilization plane 2 through the implantation of light species into a first substrate 1 in such a way as to foini a useful layer 3 between this plane and a surface of the first substrate;
  b) the application of the support 4 onto the surface of the first substrate 1 to form an assembly to be fractured 5, having two exposed sides S1, S2;
  c) the thermal fragilization treatment of the assembly to be fractured 5; and
  d) the initiation and self-sustained propagation of a fracture wave in the first substrate 1 along the fragilization plane 2.

During this method, the implanted species cause the development of microcavities. The effect of the thermal fragilization treatment is to promote the coalescence and pressurization of these microcavities. Under the effect of this thermal treatment alone, or through additional external forces, the initiation and self-sustained propagation of a fracture wave enables the transfer of the useful layer 3 through detachment in the fragilization plane 2.

This method, described notably in the documents WO2005/043615 and WO2005/043616 and designated by the name of "SMART CUT®," is useful, in particular, for the manufacture of silicon-on-insulator substrates. In this case, the first substrate 1 and the support 4 are formed from a silicon wafer, and one or the other of the first substrate 1 and the support 4 are surface-oxidized.

These silicon-on-insulator substrates must comply with very precise specifications. This applies, in particular, to the average thickness and uniformity of thickness of the useful layer 3. Compliance with these specifications is required for the correct operation of the semiconductor devices that will be formed in or on this useful layer 3.

In some cases, the architecture of these semiconductor devices requires the provision of silicon-on-insulator substrates having a very low average thickness of the useful layer 3, for example, less than 50 nm, or even less than 10 nm, and a uniformity of thickness that is highly constant on the surface of the substrate (the normalized diameter of which is typically 200 mm, 300 mm, and even 450 mm for the next generations). The expected uniformity of thickness may thus be in the order of at most 1%, corresponding to variation maxima typically ranging from +/−0.1 nm to +/−1 nm over the entire surface of the wafer.

It is customary, in terms of the SMART CUT® method, to apply complementary steps of finishing of the useful layer 3, such as etchings or surface-smoothing thermal treatments in order to seek to achieve the expected specification level.

The applicants in the case of the present disclosure have observed the presence, following the fracture step, of variations in the thickness of the useful layer 3 with a quite specific profile. These variations in thickness, in fact, appear in the form of a periodic pattern, the size of which is on the order of a nanometer, or even a half-nanometer, and the wavelength of which is on order of a millimeter, or even a centimeter. The periodic pattern may be apparent over the entire useful layer, or over a part only. This periodic pattern is thus visible on the thickness variation profile (in angstroms) along a diameter of a useful layer of a silicon-on-insulator wafer with a diameter of 300 mm obtained according to the SMART CUT® method of the prior art shown in FIG. 2 by a continuous line.

It is particularly difficult to correct this particular thickness non-uniformity profile using customary finishing techniques (etching, sacrificial oxidation, thermal softening treatment) as these techniques are ineffective in the wavelength range that these patterns have. Consequently, this periodic pattern contributes to the thickness non-uniformity of the useful layer 3 following the application of the finishing steps, which does not allow the required uniformity level to be achieved when the latter is significant.

BRIEF SUMMARY

One object of the disclosure is to propose a method for transferring a useful layer onto a support substrate, this useful layer having a periodic pattern of thickness variation, the size of which is reduced.

Studies carried out by the applicants in connection with the present disclosure have produced the finding that the origin of this periodic pattern lay in the interaction between the fracture wave and acoustic vibrations encountered in the assembly to be fractured.

More precisely, the applicants of the present disclosure found that the initiation and/or propagation of the fracture wave was liable to cause this assembly to vibrate. These Lamb-wave vibrations propagate without significant attenuation over distances comparable to the size of the substrates, and at a speed greater than the speed of the self-sustained fracture wave. They are reflected, once or several times, on the ends of the assembly to be fractured, which helps to maintain this acoustic vibration in the assembly during the propagation of the fracture wave. In relation to the present disclosure, the applicants have thus found that the modulation of the fracture wave by these acoustic vibrations was the cause of the periodic pattern of thickness variation observed on the useful layer at the end of the method.

With a view to achieving the aforementioned object, the subject-matter of the disclosure proposes a method for transferring a useful layer onto a support including the following steps of:
  formation of a fragilization plane through implantation of light species into a first substrate in such a way as to form a useful layer between this plane and a surface of the first substrate;
  application of a support onto the surface of the first substrate to form an assembly to be fractured, having two exposed sides;
  thermal fragilization treatment of the assembly to be fractured; and
  initiation and self-sustained propagation of a fracture wave in the first substrate along the fragilization plane.

According to the disclosure, at least one of the sides of the assembly to be fractured is in close contact, over a contact zone, with an absorbent element suitable for capturing and dissipating the acoustic vibrations emitted during the initiation and/or propagation of the fracture wave.

Since at least some of the emitted acoustic vibrations are absorbed by the absorbent element, the interaction of these acoustic vibrations with the fracture wave is less, and the useful layer has a periodic pattern of thickness variation that is reduced in size.

According to other advantageous and non-limiting characteristics of the disclosure, taken alone or in combination:
- the acoustic vibrations have a main frequency, and the absorbent element is chosen to capture and dissipate the acoustic waves at this main frequency;
- the contact zone extends over a part of the extent of the side of the assembly to be fractured;
- the contact zone is positioned on the side of the assembly to be fractured facing the fracture wave initiation zone;
- the initiation of the fracture wave is obtained during the thermal fragilization treatment step;
- the initiation of the fracture wave is obtained through application of a mechanical force in the fragilization plane;
- the absorbent element is placed in close contact with the side of the assembly to be fractured after the thermal treatment step and before the fracture wave initiation step through application of a mechanical force;
- a first and a second absorbent element are disposed on each of the sides of the assembly to be fractured;
- the close contact between the side of the assembly to be fractured and the absorbent element is obtained by way of a film disposed between the assembly to be fractured and the absorbent element;
- the film is formed from an adhesive material;
- the film is formed from a non-adhesive material, with a low Young's modulus of less than 5 GPa;
- the close contact between the side of the assembly to be fractured and the absorbent element is obtained through application of a pressure onto the absorbent element;
- the side of the assembly to be fractured and the absorbent element have a surface roughness of less than 0.5 nm, the close contact between the side of the assembly to be fractured and the absorbent element being obtained through their direct assembly;
- the absorbent element is made from a material having a high loss factor, greater than 0.01; and
- the absorbent element has a thickness greater than 1 mm

BRIEF DESCRIPTION OF THE DRAWINGS

The disclosure will be better understood in the light of the description that follows of particular non-limiting embodiments of the disclosure with reference to the accompanying figures, in which.

DETAILED DESCRIPTION

In order to simplify the description that follows, the same references are used for elements that are identical or perform the same function in the different described embodiments of the method, or in the method according to the prior art.

As mentioned, the studies carried out by the applicants in connection with the present disclosure have produced the finding that the origin of the periodic pattern of thickness variation of a useful layer 3 transferred by the SMART CUT® method of the prior art lay in the interaction between the self-sustained propagation of the fracture wave and the acoustic vibrations encountered in the assembly to be fractured. The fracture wave is, in fact, deviated vertically from its plane of progression according to the state of instantaneous constraint of the material through which it passes.

The term "self-sustained fracture wave" is understood to mean that the fracture, once initiated in an initiation zone, propagates autonomously, without the application of additional external force, and over the entire extent of the fragilization plane, in such a way as to detach completely the useful layer 3 from the first substrate 1.

During the thermal fragilization treatment, energy is absorbed in the fragilization plane, for example, in the form of pressure within the microcavities that develop there. On initiation of the fracture, the energy is released, causing the fracture front to progress spontaneously, resulting in the formation of a self-sustained fracture wave.

The applicants of the present disclosure have thus found that by equipping the assembly to be fractured 5 with piezoelectric sensors, the acoustic vibrations assumed the form of Lamb waves. A Lamb wave is a mechanical wave propagating, almost without attenuation, in a thin wafer of material, guided by the surfaces of the wafer.

The applicants also observed during their experimentation that the characteristic quantities of these waves were determined by the parameters of obtaining the fracture wave. Thus, and by way of example, the layer transfer method of the prior art is obtained through:
- implementation of hydrogen species, with a dose of $5 \times 10^{16}$ species/cm² in a first substrate 1 formed from an oxidized silicon wafer;
- application of a support 4 formed from a silicon wafer;
- thermal fragilization treatment carried out at 400° C. for 4 hours, during which the fracture wave is initiated spontaneously.

The measured acoustic vibrations are mainly A0-mode Lamb waves with a main frequency of 2 MHz.

When, in a second example, the thermal fragilization treatment is replaced by an annealing at 350° C. for 2 hours and the initiation of the fracture wave caused by the application of an external mechanical force in an initiation zone, the measured acoustic vibrations are mainly A0-mode Lamb waves with a main frequency of 100 kHz.

In any event, the studies carried out during the development of the present disclosure on the method of the prior art established that acoustic variations are emitted during the initiation and/or self-sustained propagation of the fracture wave in the assembly to be fractured 5, and that these acoustic vibrations were the cause of the periodic pattern of thickness variation of the useful layer 3.

Figure 4:
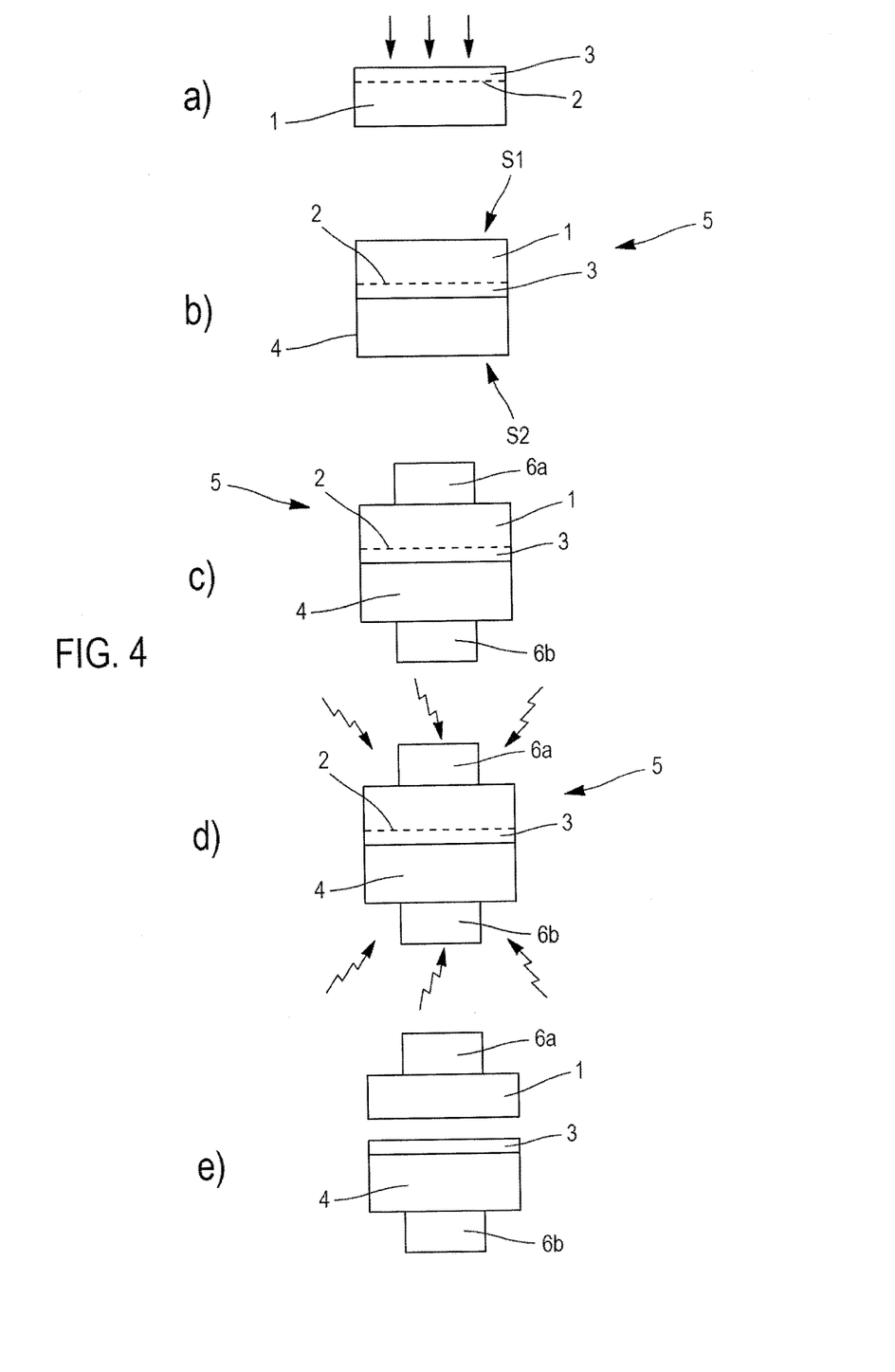
FIG. 4 shows a first embodiment of the disclosure.

The disclosure, therefore, proposes to reduce the size of the periodic patterns of thickness variation, by providing on at least one side S1, S2 of an assembly to be fractured 5, comprising a support 4 disposed on a surface of a first substrate 1, an absorbent element 6a, 6b suitable for capturing and dissipating the acoustic vibrations emitted during an initiation and/or self-sustained propagation of a fracture wave, as shown in FIG. 4.

Thus, by limiting the development of the acoustic vibrations in the assembly to be fractured 5, the disclosure reduces the size of the periodic pattern of thickness variation of the useful layer 3.

In a very general manner, the use of an absorbent element to attenuate the development of vibrations is very widespread. Moreover, numerous forms and types of this element are likely to be suitable in the application comprising the subject matter of the present disclosure.

So that the absorbent elements 6a, 6b are suitable for capturing the vibrations emitted in the assembly to be fractured, it may be favorable to limit the reflections of the vibratory waves in the contact zone between the assembly to be fractured 5 and the absorbent elements 6a, 6b.

In order to achieve this object, the absorbent elements 6a, 6b can be chosen in such a way that they have an acoustic impedance matched to that of the first substrate 1 and/or the support 4 on which they are disposed. If the first substrate 1 and the support substrate 4 are not of the same type, and in the case where the side S1 of the assembly to be fractured 5 is provided with a first absorbent element 6a, and where the side S2 is provided with a second absorbent element 6b, the first absorbent element 6a will have an acoustic impedance matched to the acoustic impedance of the first substrate 1, and the second absorbent element 6b will have an acoustic impedance matched to the acoustic impedance of the support 4.

Furthermore, the absorbent elements 6a, 6b must preferably be in close contact with the sides S1, S2 of the assembly to be fractured 5 in order to effectively transmit the mechanical deformation of the wafer toward the absorber. The term "close contact" is understood to mean that the level of contact (i.e., the ratio between the surfaces in contact and the total surface) must be high, for example, greater than 70%. Different means can be implemented in order to achieve this close contact. Notably, the following can be mentioned:

- the use of an adhesive film, for example, a polymer adhesive, between the absorbent element and the assembly to be fractured 5;
- the use of a non-adhesive film with a low Young's modulus of less than 5 GPa, such as, for example, an elastomer, between the absorbent element and the assembly to be fractured 5. In this case, the close contact may be achieved by submitting the assembly to compression forces;
- the use of an electrostatically adhesive film between the absorbent elements 6a, 6b and the assembly to be fractured 5;
- the assembly of the absorbent elements 6a, 6b through molecular adhesion, the contact zones having been prepared in advance to have a very slight roughness (typically less than 0.5 nm);
- the deposition on the contact zone of a layer of materials, this layer then forming the absorbent elements 6a, 6b.

Moreover, the absorbent elements 6a, 6b must also have characteristics ensuring that the captured acoustic vibrations are suitably dissipated.

Generally speaking, a rigid absorbent element will have to be provided with a thickness that is sufficient to dissipate the acoustic vibrations, the absorption then taking place in the thickness of the absorbent element.

Alternatively, the absorbent elements 6a, 6b may be chosen to have visco-elastic properties and to have a high loss factor, greater than 0.01. The energy of the acoustic vibrations is then effectively dissipated through viscous friction. This may involve, for example, polyurethane foam (40% density), silicon polymers or composite materials such as a polymer matrix containing high-density dispersed particles, or a composite material formed from a successive stacking of layers of visco-elastic materials and rigid materials (known by the name of "configuration sandwich" or "constrained layer damping").

Figure 3:
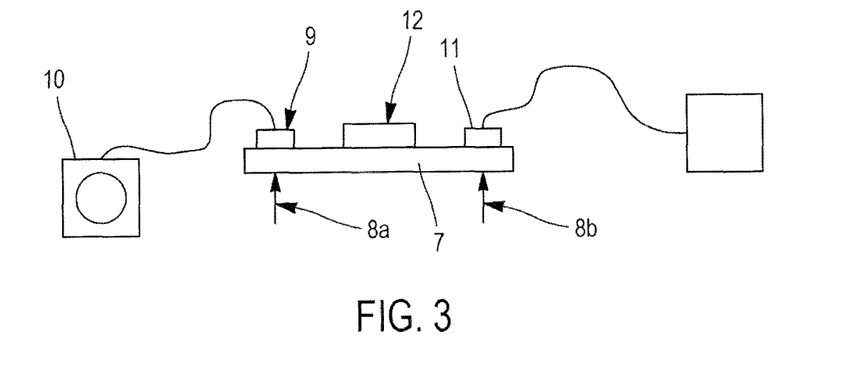
FIG. 3 shows a characterization test bench for an absorbent element to be evaluated.

The choice of the suitable absorbent element may be determined through a limited number of tests on a test bench that is simple to implement, as shown in FIG. 3. In this figure, a strip 7 of material representing material forming the assembly to be fractured, having a width of several cm and a length of around 10 cm, is held, for example, on its ends on two supports 8a and 8b. The strip 7 is provided, on a first end, with a piezoelectric element 9 connected to an electric generator 10, capable of applying an acoustic vibration with the determined characteristics to the strip 7. The strip 7 is also provided, on its other end, with a piezoelectric sensor 11 capable of measuring the characteristics of the propagated acoustic vibrations. The main surface of the strip 7 can accommodate an absorbent element to be evaluated 12.

The absorption and dissipation characteristics of the absorbent element to be evaluated 12 can, therefore, easily be determined. A signal having a controlled shape, frequency and amplitude is applied by means of the electric generator 10, generating an acoustic wave in the strip 7 provided with the absorbent element to be evaluated 12. A signal representing the acoustic wave that has propagated in the strip 7 is recorded in the sensor 11. The coefficient of absorption of the absorbent element to be evaluated 12, defined as the ratio of the amplitude of the measured signal to the amplitude of the applied signal, can then be represented, according to the frequency.

Using this test bench, it is very simple to determine the absorption and dissipation characteristics of an absorbent element to be evaluated 12.

In particular, and as previously seen, the acoustic vibrations that develop in the assembly to be fractured 5 have a main frequency, depending on the implemented layer transfer method parameters (type and dose of the implanted species, temperature and duration of the thermal fragilization treatment, fracture initiation method, etc.). The absorbent element must obviously be chosen in order to capture and dissipate the acoustic waves at this main frequency.

The absorbent elements 6a, 6b are preferably positioned on each of the exposed sides S1, S2 of the assembly to be fractured 5 and the contact zone extends over the entire extent of each of these sides. A maximum absorption of the emitted acoustic vibrations is thus ensured.

However, in order to simplify the method according to the disclosure, it is also possible to position the absorbent elements 6a, 6b on a single exposed side S1, S2 of the assembly to be fractured 5. In this case, it may be preferable to position it on the side of the first substrate 1 that, generally, following the transfer of the useful layer 3, is reprocessed and reused as the first substrate in a new layer transfer method. The first substrate 1 could then be finally provided with the absorbent element 6a.

Regardless of whether the absorbent elements 6a, 6b are applied to one and/or the other of the exposed sides S1, S2 of the assembly to be fractured 5, the contact zone may extend over only a part of the extent of the exposed side(s) S1, S2 of the assembly to be fractured 5. This may be advantageous for simplifying the removal of the absorbent elements 6a, 6b at the end of the method. The contact zone may have a main dimension (length, or diameter according to the shape) at least equal to the order of magnitude of the wavelength of the periodic pattern of thickness variation of the useful layer 3, for example, between 1 mm and 100 mm or more. It may thus be decided to position this contact zone facing the fracture wave initiation zone. The acoustic vibrations are then captured and absorbed when they are emitted. In the case where the initiation is caused by the application of an external force, the initiation zone corresponds to the point of impact of this force on the assembly to be fractured 5. When the initiation of the fracture is spontaneous, the latter is generally positioned in a particular zone of the assembly to be fractured 5, which can be determined in advance through experimentation and according to the conditions of implementation under which the layer transfer method is carried out.

Alternatively, the contact zone between the absorbent elements 6a, 6b and the exposed surfaces S1, S2 of the element to be fractured 5 can be positioned at the periphery of the assembly to be fractured 5, in such a way as to capture the acoustic vibrations when they are reflected at the ends of the assembly to be fractured 5.

Once the characteristics of the absorbent elements 6a, 6b have been determined, the disclosure is implemented according to a plurality of embodiments, which will now be described with reference to FIGS. 4 to 6.

In a first step a), shown in FIG. 4, a fragilization plane is formed through implantation of light species into the first substrate 1. The first substrate 1 may be made from silicon, or any other material, semiconducting or otherwise. This may involve, for example, germanium, gallium nitride, lithium tantalate or sapphire. Layers may have been disposed on the surface through deposition or through thermal treatment. This may involve a layer of silicon dioxide, obtained through thermal oxidation of a silicon wafer or through epitaxial deposition of any type: SiGe, InGaN, AlGaN, Ge, etc.

As far as the light species are concerned, these may be any species suitable for fragilizing the first substrate 1 in its fragilization plane. This may notably involve hydrogen and/or helium species.

The fragilization plane, along with a surface of the first substrate 1, delimits the useful layer 3.

In a second step b), a support 4 is then applied onto the surface of the first substrate 1 in order to form the assembly to be fractured 5. The support 4 may consist of a silicon wafer, or a substrate made from any other material of any shape, such as sapphire or glass. As with the first substrate 1, the support 4 may have been provided with surface layers of any type.

The application of the support 4 to the surface of the first substrate 1 can be implemented by any direct assembly method: through molecular adhesion, through thermocompression, through electrostatic adhesion, etc. The application of the support 4 may also correspond to the deposition of a material onto the surface of the first substrate 1, the deposited layer forming the support 4.

In a following step c) and according to a first embodiment of the disclosure, the absorbent element(s) 6a, 6b is/are then disposed in close contact with the exposed side S1, S2 of the assembly to be fractured 5. As previously described, the absorbent elements 6a, 6b may be provided with an adhesive or non-adhesive film (not shown in FIG. 4) in order to reinforce the close contact.

The close contact may also be reinforced by establishing the contact in an environment with a pressure lower than atmospheric pressure, in a partial vacuum. The appearance of air bubbles at the interface between the exposed surface S1, S2 of the assembly to be fractured 5 and the absorbent element 6a, 6b is thus limited.

In a following step d), a thermal fragilization treatment is then applied to the assembly to be fractured 5, provided with one or more absorbent elements 6a, 6b. As previously explained, this thermal treatment fragilizes the first substrate 1 in its fragilization plane 2, and supplies enough energy for the fracture wave, once initiated, to propagate in a self-sustained manner. This thermal treatment is typically between 150° C. and 600° C. for a period from 30 minutes to 8 hours, such as, for example, for 4 hours at 400° C.

In a first alternative embodiment, the thermal treatment is sufficient on its own to initiate the fracture wave. At the end of the thermal treatment, the useful layer 3 is entirely detached from the first substrate 1.

In a second alternative embodiment, an external force is exerted, during or after the thermal treatment, in order to initiate the fracture wave. This external force may be of mechanical origin or of any other origin. It may, for example, be a localized heating implemented by a laser, or a provision of energy through ultrasound.

During the application of the thermal treatment, a pressure may optionally be exerted on the assembly to be fractured 5 and the absorbent elements 6a, 6b, in such a way as to increase their contact surfaces and place this assembly in a close-contact condition. This pressure may be exerted via equipment in which the assembly is placed.

Regardless of the alternative embodiment that is implemented, the fracture wave, once initiated, propagates in a self-sustained manner in order to detach and transfer the useful layer 3 onto the support 4, as shown in step b) in FIG. 4.

According to the disclosure, the acoustic vibrations emitted during the initiation and/or propagation of the fracture wave are captured and absorbed by the absorbent elements 6a, 6b. Consequently, the interaction of these acoustic vibrations with the fracture wave is limited and the useful layer 3 has a periodic pattern of thickness variation that is reduced in size.

Figure 2:
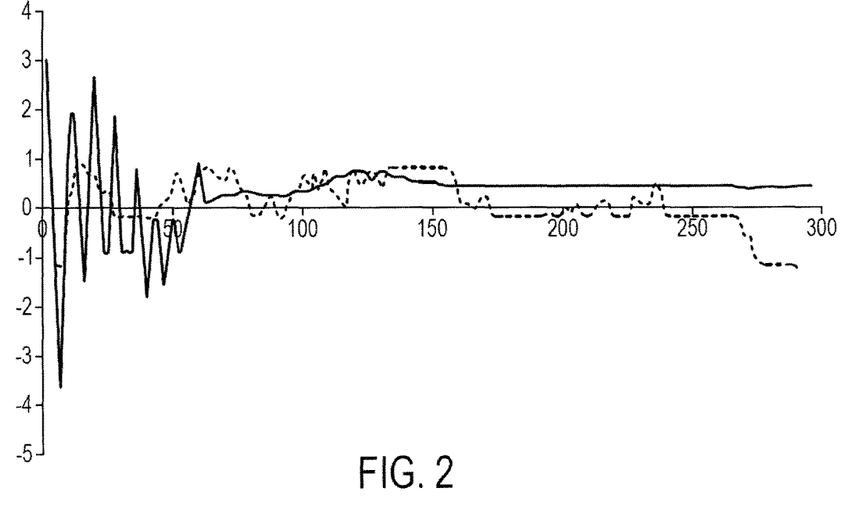
FIG. 2 shows a thickness variation profile (in angstroms) of a silicon-on-insulator wafer with a diameter of 300 mm, for the method according to the prior art (continuous line) and according to the disclosure (dotted line)

In this respect, FIG. 2 shows, as a dotted line, a thickness variation profile (in angstroms) along a diameter of a silicon-on-insulator wafer with a diameter of 300 mm obtained through application of the disclosure, the absorbent elements 6a, 6b consisting of a polyurethane foam with a thickness of 3 mm and attached via a PVDC film. The size of the thickness variations is less than 0.1 nm. This profile can be compared with the continuous-line profile in the same FIG. 2, in which the thickness variations obtained under the same conditions, but without the application of an absorbent element 6a, 6b, were more than 0.3 nm.

In a final step 1) (not shown) of the method, the absorbent elements 6a, 6b and, in particular, the absorbent element positioned on the side S2 of the support 4, is removed.

Before, or preferably after, this removal step, any finishing step (thermal smoothing treatment, thinning through sacrificial oxidation or through etching, etc.) enabling the manufacture of the final structure to be completed can be applied.

Figure 5:
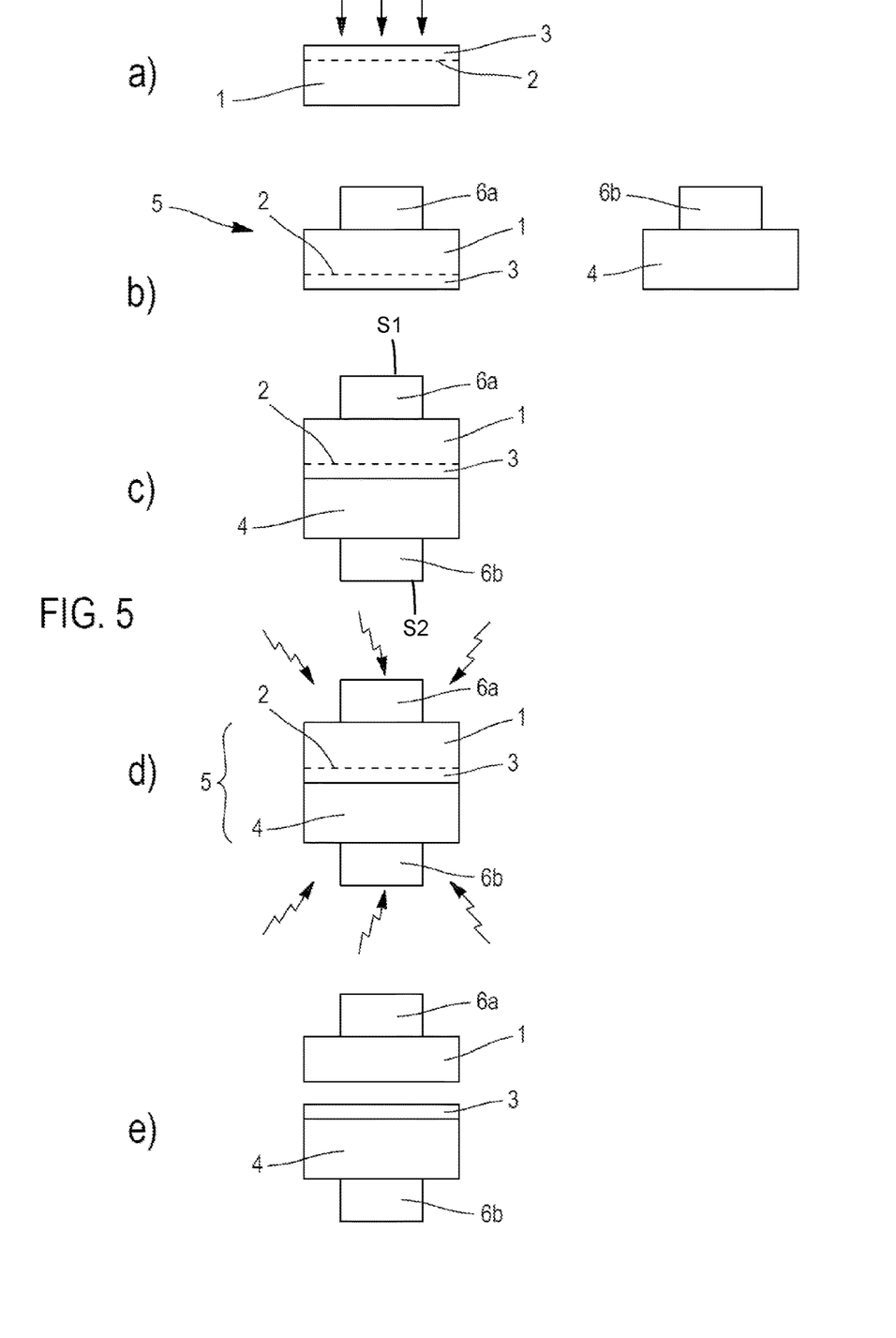
FIG. 5 shows a second embodiment of the disclosure.

In a second embodiment of the structure, shown in FIG. 5, the absorbent element(s) 6a, 6b is/are placed in close contact with the respective exposed sides S1, S2 of the first substrate 1 and/or the support 4, before step b) of application of the support 4 to the surface of the first substrate 1.

Figure 6:
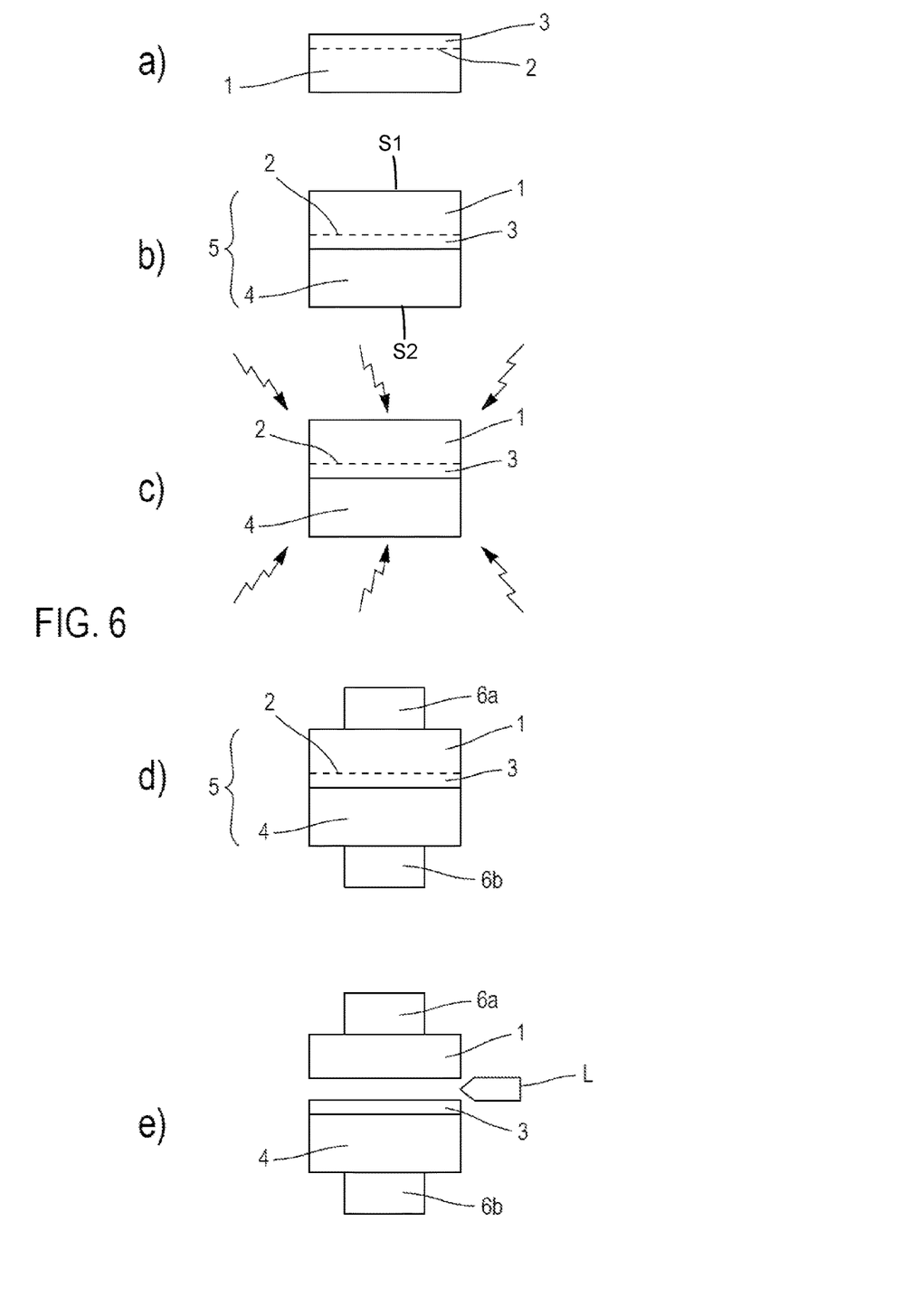
FIG. 6 shows a third embodiment of the disclosure.

According to a third, and particularly advantageous, embodiment, shown in FIG. 6, the absorbent elements 6a, 6b are placed in close contact with the exposed sides S1, S2 of the element to be fractured, after step d) of thermal fragilization treatment and before the fracture wave initiation and propagation step.

In this case, the initiation of the fracture wave is caused, after the thermal treatment and once the absorbent elements 6a, 6b are positioned, by the application of an external force, for example, by the application of a blade L in the fragilization plane 2.

This third embodiment has the advantage of not exposing the absorbent elements 6a, 6b to the thermal fragilization treatment, which could result in the opposite case in degrading them or rendering their removal more difficult at the end of the method.

By limiting the size of the periodic pattern of thickness variation of the useful layer 3, the disclosure can be applied, in particular, to the manufacture of a structure comprising a useful layer 3 with a thickness, after finishing, of less than 50 nm or 10 nm. In fact, for this thickness, the contribution of the thickness variations linked to the periodic profile examined by the disclosure (on the order of a nanometer) is significant. The disclosure is also particularly useful when the first substrate 1, from which the useful layer 3 originates, has a substantial dimension (200 mm, 300 mm, 450 mm), for which the fracture wave propagation and acoustic vibration effects are more marked.

The disclosure may also relate to the manufacture of a silicon-on-insulator wafer, the first substrate 1 then being formed from an oxidized silicon wafer, this support 4 being formed from a silicon wafer.

The examples that follow, therefore, illustrate the disclosure applied to the manufacture of a silicon-on-insulator structure of this type.

In a first example, the absorbent elements 6a, 6b are formed from a very thick silicon wafer (1 cm) provided on one of its sides with a 20-micron (non-adhesive) elastomer film with a Young's modulus of less than 5 GPa. An absorbent element 6a, 6b of this type is associated, on the elastomer film side, on each of the exposed sides S1, S2 of the element to be fractured 5, the latter having already undergone the thermal fragilization treatment. A pressure exerted on the exposed surfaces of the assembly provides the close contact between the absorbent elements 6a, 6b and the assembly to be fractured 5. The matching of the acoustic impedances between the elements to be fractured 5 and the absorbent elements 6a, 6b is ensured since they are formed from the same material and the elastomer layer is sufficiently thin to be acoustically transparent. The emitted acoustic vibrations are dissipated in the mass of the absorbent elements 6a, 6b.

An external force, such as the insertion of a blade into the fragilization plane, initiates the fracture wave and its self-sustained propagation. Following the removal of the pressure maintaining the close contact of the absorbent elements 6a, 6b, the latter are removed without difficulty, the structure not having undergone any temperature treatment.

In a second example, the thick and bare silicon wafers, i.e., without the elastomer film of the preceding example, are prepared in advance to have a surface with a roughness of less than 0.5 nm. They are then assembled through molecular adhesion to the first silicon substrate and to the silicon support 4 before the step of application of the support 4 onto the surface of the first substrate 1. The method continues, and in the context of this example, the initiation of the fracture wave is obtained during the thermal treatment step, which consists of the application of a temperature of 500° C. for 1 hour.

Following the fracture, the absorbent elements 6a, 6b are removed from the exposed sides S1, S2 of the first substrate 1 and the support 4 through the introduction of a blade in the adhesion interfaces. In this example, the absorbent elements 6a, 6b are exposed to the thermal fragilization treatment. This is made possible since no film likely to undergo temperature degradation has been used to establish the close contact.

In a third example, the absorbent elements 6a, 6b are formed from a PVDC film onto which a layer of around 3 mm of polyurethane foam (having a density of 40%) is electrostatically adhered. The absorbent elements 6a, 6b have the same dimensions as the first substrate 1 and the support 4. At least one absorbent element 6a, 6b is electrostatically attached to at least one of the exposed sides S1, S2 of the assembly to be fractured 5, according to the same sequence as in the first example.

The PVDC film ensures the close contact between the absorbent elements 6a, 6b and the first substrate 1 and the support 4, respectively. The bond strength nevertheless remains low so that, following the fracture step, it is easy to remove the absorbent elements 6a, 6b. Furthermore, the polyurethane foam, having a high loss factor greater than 0.01, is particularly suitable for dissipating the captured acoustic vibrations. A relatively low thickness, of a few mm, is enough to significantly reduce the size of the periodic profile of thickness variation of the useful layer 3.

In a final example, the absorbent elements 6a, 6b are formed from a sandwich configuration comprising, for example, a stack of 10 to 20 successive layers including, in a repeated manner, a first adhesive polymer film with a thickness of around 100 microns and an aluminium metal sheet also of around 100 microns. The stack has a total thickness of between 1 and 5 mm. This absorbent element 6a, 6b is positioned in close contact with the exposed sides S1, S2 of the assembly to be fractured 5, via the surface polymer layer of the absorbent element 6a, 6b. This absorbent element 6a, 6b has a high loss factor, well above 0.01, the acoustic vibration, in fact, causing a shearing of the polymer layers, caused by the relatively rigid aluminium sheets. This particular configuration of the absorbent element 6a, 6b results in a particularly effective dissipation of the transmitted acoustic power. Consequently, the size of the periodic pattern of thickness vibration of the useful layer is particularly reduced.

The disclosure is obviously not limited to the embodiments described, and alternative embodiments can be provided without exceeding the scope of the disclosure as defined by the claims.

What is claimed is:

1. A method for transferring a useful layer onto a support, the method comprising:
    formatting a fragilization plane by implanting light species into a first substrate in such a manner as to define a useful layer between the fragilization plane and a surface of the first substrate;
    applying the support onto the surface of the first substrate to form an assembly to be fractured, the assembly having two exposed sides;
    thermally treating the assembly to be fractured and weakening the assembly along the fragilization plane;
    adjoining at least one of the two exposed sides of the assembly to be fractured with a vibration absorbent element over a contact zone; and
    initiating a propagating and self-sustaining fracture wave in the first substrate along the weakened fragilization plane, and capturing and dissipating acoustic vibrations emitted during the initiation and/or propagation of the fracture wave in the vibration absorbent element.

2. The method according to claim 1, further comprising selecting the absorbent element to be configured to capture and dissipate the acoustic vibrations at a main frequency of the acoustic vibrations.

3. The method according to claim 1, further comprising forming the contact zone to extend over only a portion of a surface area of the at least one of the two exposed sides of the assembly to be fractured.

4. The method according to claim 3, wherein the contact zone is positioned on a side of the assembly to be fractured proximate an initiation zone in which the fracture wave is initiated.

5. The method according to claim 1, wherein thermally treating the assembly to be fractured and weakening the assembly along the fragilization plane comprises exposing the assembly to a temperature or temperatures between 150° C. and 600° C. for a period of time in a range extending from 30 minutes to 8 hours.

6. The method according to claim 1, wherein the initiation of the propagating and self-sustaining fracture wave occurs while thermally treating the assembly to be fractured and weakening the assembly along the fragilization plane.

7. The method according to claim 1, wherein initiating a propagating and self-sustaining fracture wave comprises applying a mechanical force in the fragilization plane.

8. The method according to claim 7, further comprising adjoining the at least one of the two exposed sides of the assembly to be fractured with the vibration absorbent element after thermally treating the assembly to be fractured and weakening the assembly along the fragilization plane and before applying the mechanical force in the fragilization plane and initiating the propagating and self-sustaining fracture wave.

9. The method according to claim 1, further comprising removing the vibration absorbent element after initiating the propagating and self-sustaining fracture wave.

10. The method according to claim 1, wherein adjoining the at least one of the two exposed sides of the assembly to be fractured with the vibration absorbent element comprises adjoining one of the two exposed sides of the assembly with a first vibration absorbent element and adjoining another of the two exposed sides of the assembly with a second absorbent element.

11. The method according to claim 10, wherein the first vibration absorbent element is adjoined with the first substrate and has an acoustic impedance matched to an acoustic impedance of the first substrate.

12. The method according to claim 11, wherein the second vibration absorbent element is adjoined with the support and has an acoustic impedance matched to an acoustic impedance of the support.

13. The method according to claim 1, further comprising disposing a film between the at least one of the two exposed sides of the assembly to be fractured and the vibration absorbent element.

14. The method according to claim 13, wherein the film comprises an adhesive material.

15. The method according to claim 13, further comprising electrostatically adhering the film to the at least one of the two exposed sides of the assembly to be fractured and the vibration absorbent element.

16. The method according to claim 13, wherein the film comprises a non-adhesive material having a Young's modulus of less than 5 GPa.

17. The method according to claim 1, further comprising applying pressure onto the vibration absorbent element to adjoin the at least one of the two exposed sides of the assembly to be fractured with the vibration absorbent element.

18. The method according to claim 1, further comprising directly contacting adjoining surfaces of the at least one of the two exposed sides of the assembly and the vibration absorbent element over the contact zone, wherein the adjoining surface of the assembly and the adjoining surface of the vibration absorbent element each have a surface roughness of less than 0.5 nm.

19. The method according to claim 1, wherein the vibration absorbent element comprises a material having a loss factor greater than 0.01.

20. The method according to claim 19, wherein the vibration absorbent element comprises at least one of a visco-elastic material, a composite material, or a sandwich configuration.

21. The method according to claim 1, wherein the vibration absorbent element has a thickness greater than 1 mm.

* * * * *

UNITED STATES PATENT AND TRADEMARK OFFICE
CERTIFICATE OF CORRECTION

PATENT NO. : 9,589,830 B2
APPLICATION NO. : 14/686229
DATED : March 7, 2017
INVENTOR(S) : Didier Landru et al.

It is certified that error appears in the above-identified patent and that said Letters Patent is hereby corrected as shown below:

In the Specification

Column 1, Line 24, change "as to foini" to --as to form--
Column 8, Line 49, change "a final step 1)" to --a final step f)--

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*